United States Patent
Alur et al.

(10) Patent No.: US 9,728,500 B2
(45) Date of Patent: Aug. 8, 2017

(54) INTEGRATED CIRCUIT SURFACE LAYER WITH ADHESION-FUNCTIONAL GROUP

(71) Applicant: Intel Corporation, Santa Clara, CA (US)

(72) Inventors: Siddharth K. Alur, Chandler, AZ (US); Sri Chaitra J. Chavali, Chandler, AZ (US); Robert A. May, Chandler, AZ (US); Whitney M. Bryks, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/972,936

(22) Filed: Dec. 17, 2015

(65) Prior Publication Data

US 2017/0179019 A1    Jun. 22, 2017

(51) Int. Cl.
*H01L 23/52* (2006.01)
*H01L 23/528* (2006.01)
(Continued)

(52) U.S. Cl.
CPC ...... *H01L 23/528* (2013.01); *H01L 21/02118* (2013.01); *H01L 21/02282* (2013.01);
(Continued)

(58) Field of Classification Search
CPC .................................................. H01L 23/528
See application file for complete search history.

(56) References Cited

U.S. PATENT DOCUMENTS 4,767,674 A * 8/1988 Shirai ............... B32B 15/08
                                                              257/E23.006
5,928,791 A * 7/1999 Rosenmayer ........ B05D 3/007
                                                              257/E21.241

(Continued)

OTHER PUBLICATIONS

International Search Report and Written Opinion mailed Feb. 20, 2017 for International Application No. PCT/US2016/061275, 14 pages.

(Continued)

*Primary Examiner* — Evren Seven
*Assistant Examiner* — S. M. S. Imtiaz
(74) *Attorney, Agent, or Firm* — Schwabe, Williamson & Wyatt, P.C.

(57) ABSTRACT

Embodiments of the present disclosure describe an integrated circuit and associated fabrication techniques and configurations, which may include forming on at least one of a metal layer or a polymer layer of an integrated circuit die a surface layer that includes an adhesion-functional group, and applying to the surface layer a next layer to adhere to the surface layer with the adhesion-functional group. In embodiments wherein the at least one of the metal layer or the polymer layer is a polymer layer, forming the surface layer may include copolymerizing on the polymer layer a polar monomer that includes the adhesion-functional group. In embodiments wherein the at least one of the metal layer or the polymer layer is a metal layer, forming the surface layer may include forming on the metal layer a self-assembled monolayer that includes amine group terminations. Other embodiments may be described and/or claimed.

13 Claims, 4 Drawing Sheets

(51) Int. Cl.
H01L 21/768 (2006.01)
H01L 21/3105 (2006.01)
H01L 21/3205 (2006.01)
H01L 21/02 (2006.01)

(52) U.S. Cl.
CPC .. *H01L 21/31058* (2013.01); *H01L 21/32051* (2013.01); *H01L 21/76834* (2013.01); *H01L 21/76841* (2013.01)

(56) References Cited

U.S. PATENT DOCUMENTS

| | | | |
|---|---|---|---|
| 6,372,027 | B1 | 4/2002 | Tomaiuolo et al. |
| 6,531,340 | B2* | 3/2003 | Jiang ............... C09J 5/00 257/E21.505 |
| 2001/0008828 | A1* | 7/2001 | Uchikura ............ C09G 1/02 451/41 |
| 2005/0085031 | A1 | 4/2005 | Lopatin et al. |
| 2006/0145181 | A1* | 7/2006 | Ufert ................. B82Y 10/00 257/102 |
| 2010/0264553 | A1* | 10/2010 | Wainerdi .............. H01L 24/29 257/783 |
| 2011/0186830 | A1* | 8/2011 | Burroughes ........ H01L 51/0013 257/40 |
| 2015/0147879 | A1 | 5/2015 | Chatterjee et al. |
| 2015/0206793 | A1 | 7/2015 | Subramani et al. |

OTHER PUBLICATIONS

Hetemi, Dardan et al., "Surface Modification of Polymers by Reaction of Alkyl Radicals", Langmuir, Dec. 10, 2015, vol. 32, No. 2, pp. 512-518.

* cited by examiner

INTEGRATED CIRCUIT SURFACE LAYER WITH ADHESION-FUNCTIONAL GROUP

TECHNICAL FIELD

Embodiments of the present disclosure generally relate to the field of integrated circuits, and more particularly, to adhesion-receptive surfaces for integrated circuit die layers and associated techniques and configurations.

BACKGROUND

Currently, integrated circuit dies include successive layers, such as polymer/polymer, polymer/metal or polymer/silica, between which there may be low adhesion. Techniques to improve adhesion between polymer/polymer and polymer/silica layers may include plasma or ultra-violet (UV) treatment of the surfaces to enhance the surface area or surface energy. Techniques to improve adhesion between polymer and an underlying metal layer may include etching of the metal, but etching may degrade electrical performance or patterning.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
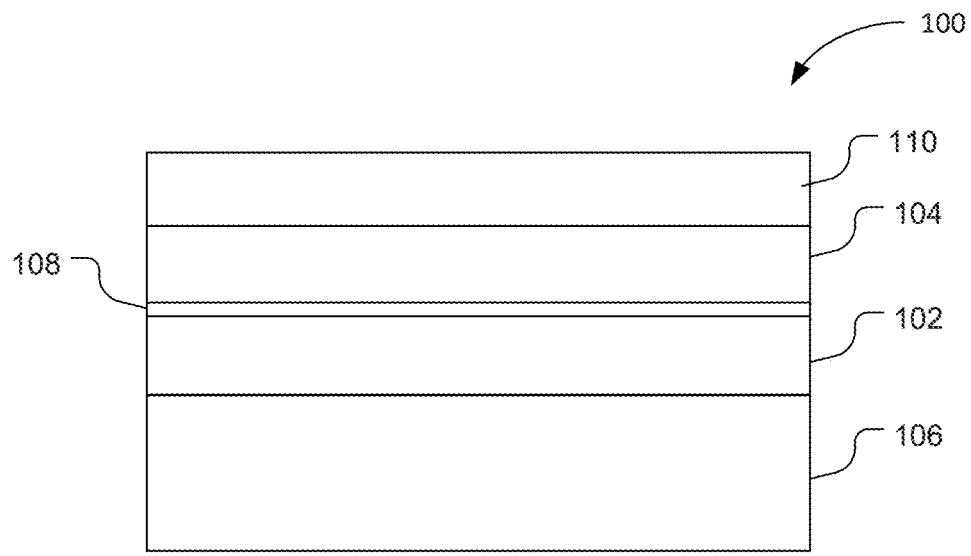
FIG. 1 schematically illustrates a cross-section view of an example integrated circuit (IC) die, in accordance with some embodiments.

Embodiments of the present disclosure describe an integrated circuit and associated fabrication techniques and configurations, which may include forming on at least one of a metal layer or a polymer layer of an integrated circuit die a surface layer that includes an adhesion-functional group, and applying to the surface layer a next layer to adhere to the surface layer with the adhesion-functional group. In embodiments wherein the at least one of the metal layer or the polymer layer is a polymer layer, forming the surface layer may include copolymerizing on the polymer layer a polar monomer that includes the adhesion-functional group. In embodiments wherein the at least one of the metal layer or the polymer layer is a metal layer, forming the surface layer may include forming on the metal layer a self-assembled monolayer that includes amine group terminations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 schematically illustrates a cross-section view of an example integrated circuit (IC) die 100 with layers 102 and 104, in accordance with some embodiments. The die 100 may represent a discrete product made on a substrate of semiconductor material (e.g., silicon) using semiconductor fabrication techniques such as thin film deposition, lithography, etching, and the like used in connection with forming IC devices. In embodiments, the die 100 may be, include, or be a part of a radio frequency (RF) die, a processor, memory, system-on-chip (SoC), or ASIC, for example.

Layers 102 and 104 may be two of two or more layers that are included in die 100. In embodiments, layer 102 may be of or include a polymer and may be referred to as polymer layer 102. Polymer layer 102 may be formed upon one or more die layers 106 (only one shown), which may include a semiconductor substrate. Layer 104 may be applied to die 100 after polymer layer 102 and may be formed of or include metal, silica or polymer. An adhesion-receptive surface 108 may be formed between layers 102 and 104 to enhance adhesion between them. The adhesion-receptive surface 108 enhance adhesion between layers 102 and 104 without adversely affecting mechanical and/or electrical properties of the bulk of polymer layer 102.

In embodiments, a layer 110 may optionally be applied to die 100 after layer 104. Layer 104 and/or 110 may be incorporated onto die 100 or may be an embedding or encapsulating material that embeds or encapsulates die 100 in or as part of an IC package or package assembly (not shown).

Figure 2:
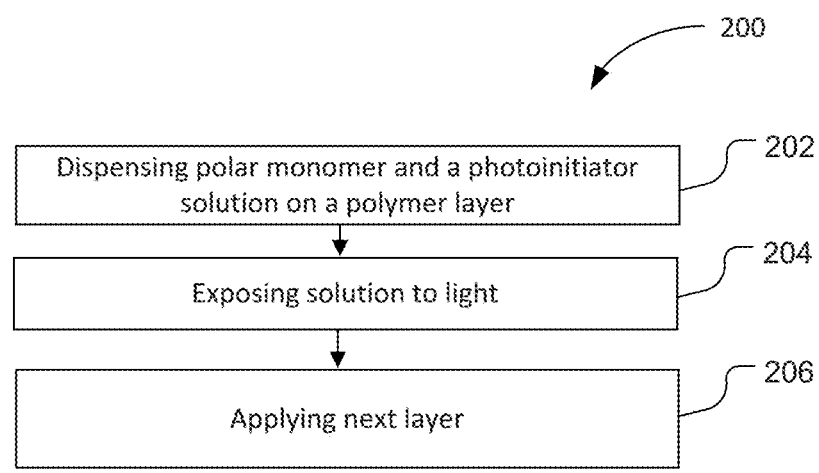
FIG. 2 schematically illustrates a flow diagram for a method of fabricating an IC, in accordance with some embodiments.

FIG. 2 schematically illustrates a flow diagram for a method 200 of fabricating an IC, in accordance with some embodiments. The method 200 may comport with the configuration of die 100 in FIG. 1, for example.

At 202, the method 200 may include dispensing on a polymer layer of a die a solution that includes a polar monomer and a photoinitiator. In embodiments, the polymer layer may be polymer layer 102, and the polar monomer may include an adhesion-functional group that functionalizes adhesion between the polymer layer and the next layer. In embodiments, the functional group may include an amine group if the next layer includes or is of silica, a cyano group if the next layer includes or is of a metal such as copper (Cu), or a hydroxyl group if the next layer includes or is of a polymer. Dispensing the solution on the polymer layer may include applying the solution in liquid form, such as by dipping the die and the polymer layer into the solution. In other embodiments, the polar monomer may include more than one adhesion-functional group to functionalize adhesion between the polymer layer and the next layer. In embodiments, the more than one functional groups may include an amine group and a cyano group if the next layer includes or is of a metal such as copper, or may include an amine group and a hydroxyl group if the next layer includes or is of silica.

At 204, the method 200 may include exposing the solution on the polymer layer to light to form on the polymer layer an adhesion-receptive polymer surface, which may also be referred to as a surface layer that includes an adhesion-functional group. In embodiments, the light may be ultraviolet light that may graft copolymerize the polar monomer on the polymer layer to form the adhesion-receptive polymer surface. The adhesion-receptive polymer surface may correspond to adhesion-receptive surface 108 of FIG. 1.

At 206, the method 200 may include applying a next layer to the adhesion-receptive polymer surface to affix the next layer to the polymer layer. In embodiments, the next layer applied to the adhesion-receptive polymer surface may be formed of or include materials that may include metal, silica, or polymer. The next layer may correspond to layer 104 of FIG. 1. In embodiments, the next layer may be of or include silica if the functional group of the polar monomer at 202 includes an amine group, the next layer may be of or include a metal such as copper (Cu) if the functional group of the polar monomer at 202 includes a cyano group, or the next layer may be of or include a polymer if the functional group of the polar monomer at 202 includes or a hydroxyl group. In other embodiments, the next layer may be of or include a metal such as copper if the polar monomer includes more than one adhesion-functional group, such as an amine group and a cyano group, and the next layer may be of or include silica if the polar monomer includes more than one adhesion-functional group, such as an amine group and a hydroxyl group.

The method 200 may provide to polymer layer 102 the adhesion-receptive surface layer 108 without affecting properties of the bulk of polymer layer 102. In embodiments, polymer layer 102 may be free from adhesion-functional groups by which adhesion-receptive surface layer 108 may functionalize adhesion between polymer layer 102 and the next layer 104. Adhesion-functional groups included in the bulk of polymer layer 102 may adversely affect mechanical and/or electrical properties of polymer layer 102, including any or all of high modulus, low CTE, low dielectric loss, etc., which may adversely affect reliability of an IC. Polymer layer 102 may be free from adhesion-functional groups such that adhesion-functional groups are completely or sufficiently absent from the bulk of polymer layer 102 that its mechanical and/or electrical properties are substantially unchanged. In embodiments, adhesion-receptive surface layer 108 may include an adhesion-functional group, and polymer layer 102 may be free from the adhesion-functional group.

In embodiments, the adhesion-receptive polymer surface provided by method 200 may be very thin (40-50 nm) and uniform. The uniformity may smooth out issues that may be observed after some wet or dry process treatments. The adhesion-receptive polymer surface provided by method 200 may also enable polymer surfaces with higher surface energy and wettability. In embodiments, polar functional groups (e.g., carboxylic acid, amides, alcohols, etc.) may be employed to improve surface energy and/or wettability without resorting to plasma or UV treatment. If used for a solder resist layer, for example, method 200 may resolve or decrease solder resist surface transparency issues.

Die embedding in a polymer material may be employed in some IC packages and package assemblies, including system-in-package technologies that may include more than one IC die. Delamination between an embedded IC die and an encapsulating dielectric may be a serious reliability issue. Method 200 may improve wettability for subsequent polymers included in mold, underfill, or encapsulant materials. A polymer or dielectric may be functionalized through graft polymerization with adhesion-functional groups, which may include amines or silanols, to bind embedding surfaces with greater reliability.

Figure 3:
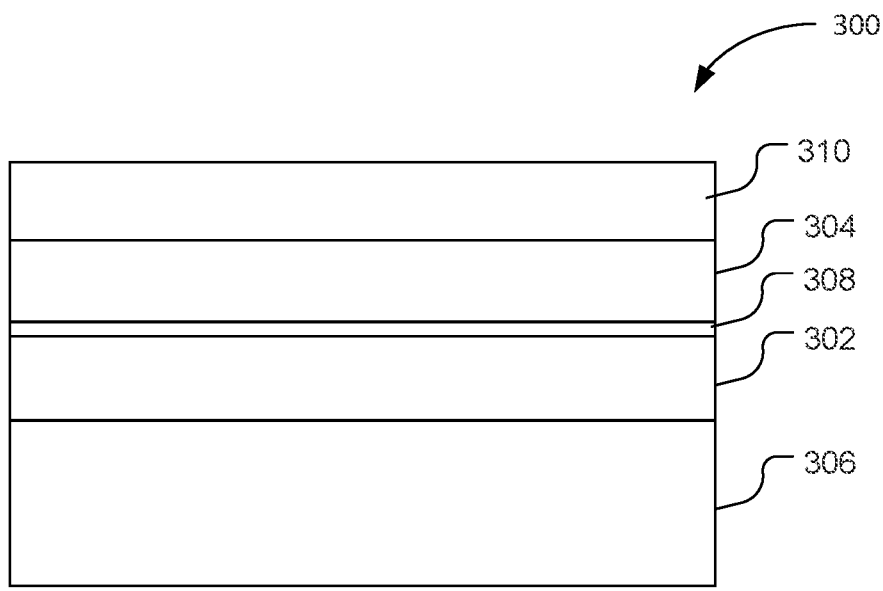
FIG. 3 schematically illustrates a cross-section view of another example IC die, in accordance with some embodiments.

FIG. 3 schematically illustrates a cross-section view of another example IC die 300 with layers 302 and 304, in accordance with some embodiments. The die 300 may represent a discrete product made on a substrate of semiconductor material (e.g., silicon) using semiconductor fabrication techniques such as thin film deposition, lithography, etching, and the like used in connection with forming IC devices. In embodiments, the die 300 may be, include, or be a part of a radio frequency (RF) die, a processor, memory, system-on-chip (SoC), or ASIC, for example.

Layers 302 and 304 may be two of two or more layers that are included in die 300. In embodiments, layer 302 may be of or include a metal (e.g., copper) and may be referred to as metal layer 302. Metal layer 302 may be formed upon one or more die layers 306 (only one shown), which may include a semiconductor substrate. Layer 304 may be applied to die 300 after metal layer 302 and may be formed of or include polymer. An adhesion-receptive surface 308 may be formed between layers 302 and 304 to enhance adhesion between them. In embodiments, a layer 310 may optionally be applied to die 300 after layer 304. Layer 304 and/or 310 may be incorporated onto die 300 or may be an embedding or encapsulating material that embeds or encapsulates die 300 in or as part of an IC package or package assembly (not shown).

Figure 4:
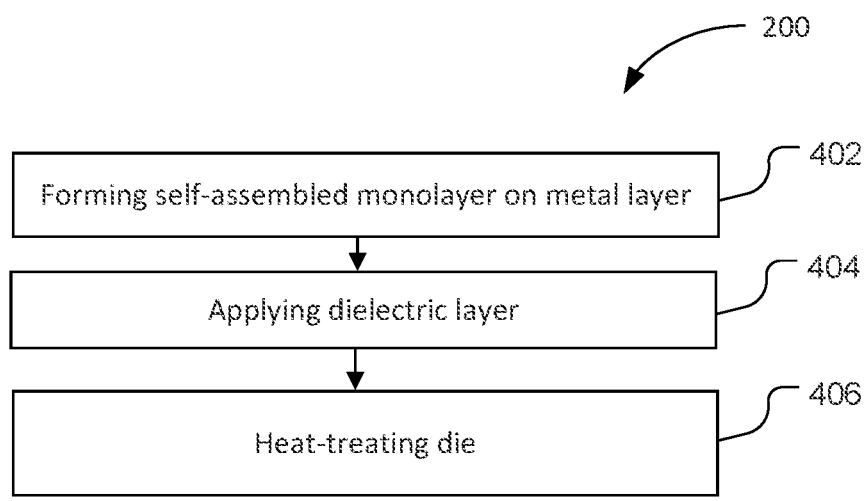
FIG. 4 schematically illustrates a flow diagram for another method of fabricating an IC, in accordance with some embodiments.

FIG. 4 schematically illustrates a flow diagram for a method 400 of fabricating an IC, in accordance with some embodiments. The method 400 may comport with the configuration of die 300 in FIG. 3, for example.

At 402, the method 400 may include forming on a metal layer (e.g., copper) of a die a self-assembled monolayer (SAM) that includes amine group terminations. The SAM may be referred to as a surface layer that includes an adhesion-functional group. In embodiments, the metal layer may be metal layer 302, and forming the SAM may include applying to the metal layer an ethanolic solution that includes an alkane thiol with a terminal amine group, as described in greater detail below. The amine group may be referred to as an adhesion-functional group that functionalizes adhesion between the metal layer and the next layer.

At 404, the method 400 may include applying a dielectric layer on the surface layer. In embodiments, the dielectric layer may include an epoxy resin.

At 406, the method 400 may include heat-treating the die to affix the dielectric layer to the metal layer. In embodiments, heat-treating may arise by contact and elevated temperature of a rubber press or a steel press, or by a final IC polymer cure, which may provide a more prolonged heat-treatment period.

SAMs are instances of molecular interactions that lead to supramolecular order. In embodiments, alkanes having a head group with an affinity for a surface may assemble in a close-packed network (e.g., in order to maximize van der Waals interactions). To promote adhesion with a dielectric layer, a terminal amine group may provide a chemical moiety to bond to the layer with enhanced adhesion. In embodiments, a dielectric layer may include an epoxy resin, which may include a high density of epoxide groups. Amine groups may be reactive with epoxides, and amine-based molecules may function as hardening agents for epoxy resins. Thus, after applying a dielectric layer at 404 and heat-treating at 406, covalent bonding between the SAM and the dielectric layer may be established. In embodiments, method 400 may enhance adhesion between copper and a polymer or dielectric layer with chemical interactions or bonds, rather than mechanical interactions. Chemical interactions are individually small or weak. However, when provided at sufficient density, as may be provided the SAM, chemical interaction may provide substantial adhesion.

Figure 5:
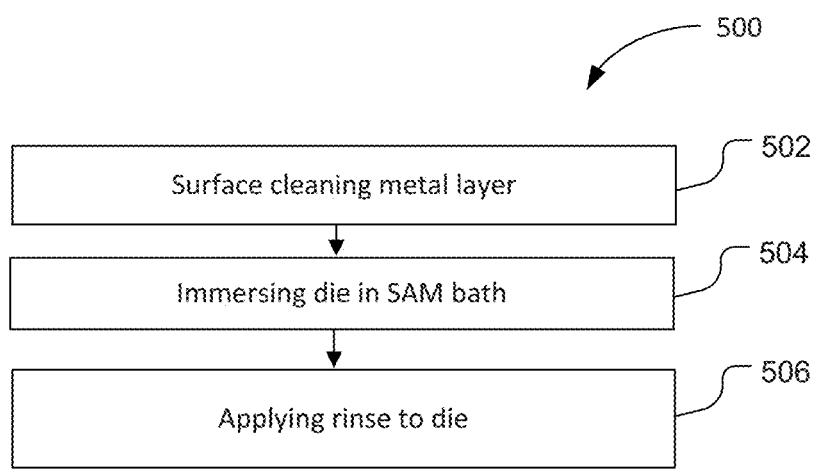
FIG. 5 schematically illustrates a flow diagram for a method of forming a self-assembled monolayer (SAM) on a metal layer of a die, in accordance with some embodiments.

FIG. 5 schematically illustrates a flow diagram for a method 500 of forming a self-assembled monolayer (SAM) on a metal layer (e.g., copper) of a die, in accordance with some embodiments.

At 502, method 500 may include surface cleaning the metal layer. In embodiments, the surface cleaning may include an acid rinse in an aqueous solution of sulfuric acid to remove oxides from the surface of the metal layer.

At 504, method 500 may include immersing the die in a SAM bath. In embodiments, the SAM bath may include may include an alkane thiol, such as 11-amino-1-undecanethiol, with a terminal amine group.

At 506, method 500 may include applying a rinse bath to the die. In embodiments, applying the rinse bath to the die may include immersing the die in an ethanol bath to remove un-bonded thiol.

Methods 400 and 500 may be performed on a metal layer, such as patterned copper, as an alternative to "CZ" chemistry. Methods 400 and 500 may be improvements over copper-roughening chemistry, which may uses many baths to facilitate oxidative etching.

Various operations are described as multiple discrete operations in turn, in a manner that is most helpful in understanding the claimed subject matter. However, the order of description should not be construed as to imply that these operations are necessarily order-dependent. For example, actions of the method 400 may be performed in another suitable order than depicted.

Figure 6:
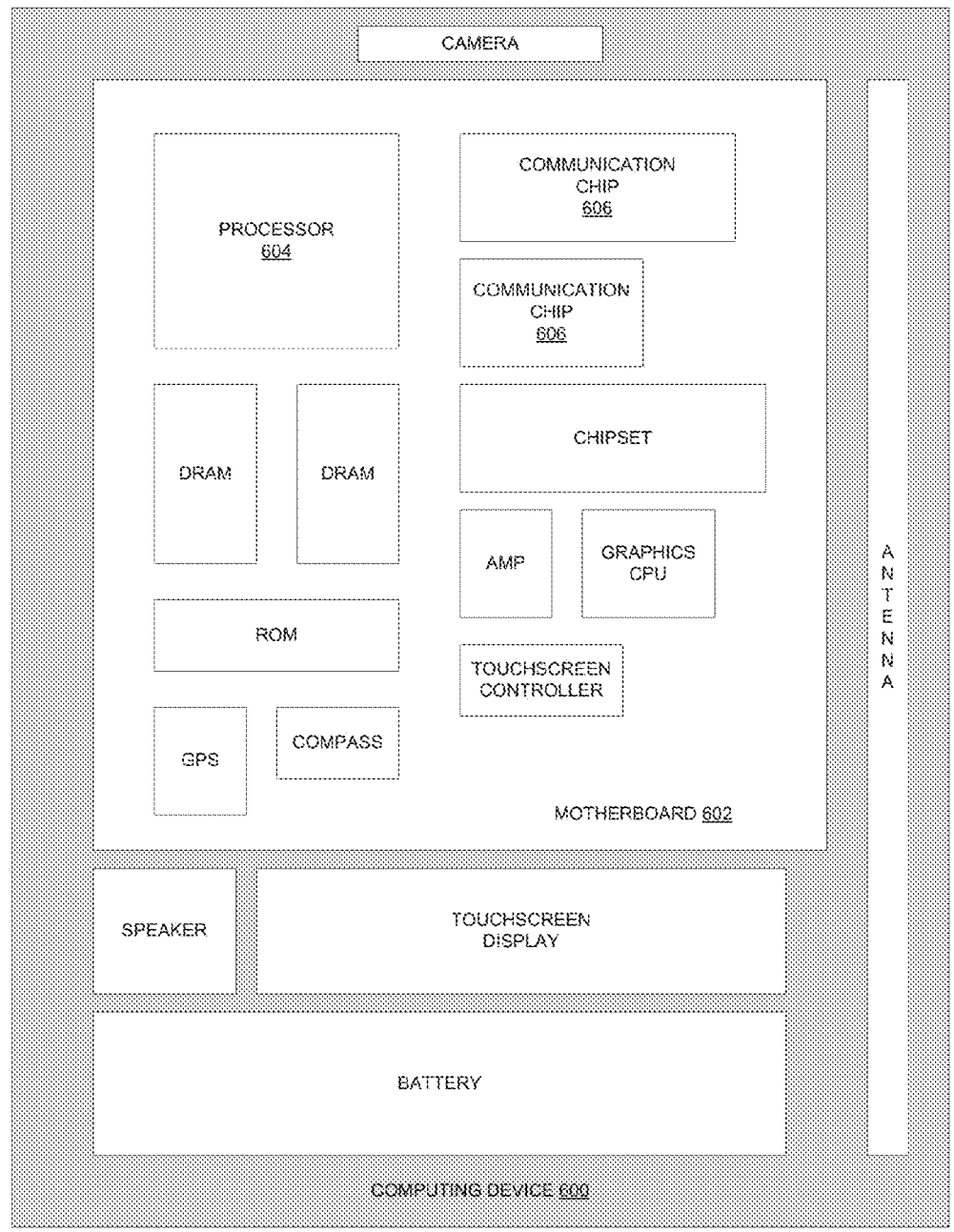
FIG. 6 schematically illustrates a computing device incorporating some aspects of embodiments described herein, in accordance with some embodiments.

Embodiments of the present disclosure may be implemented into a system using any suitable hardware and/or software. FIG. 6 schematically illustrates a computing device 600 that may include an IC as described herein, in accordance with some embodiments. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604. In some embodiments, the processor 604 and/or chip 606 may comprise an IC, such as IC 100 or 300 described in reference to FIGS. 1 and 3.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). The processor 604 of the computing device 600 may be packaged in a stacked IC package assembly with a memory, as described herein, and/or other components may be packaged together in a stacked IC package assembly with a memory, as described herein.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an embodiment, the computing device 600 may be a mobile computing device. In further implementations, the computing device 600 may be any other electronic device that processes data.

EXAMPLES

Some non-limiting examples are provided below.

Example 1 may include a method of fabricating an integrated circuit (IC), the method comprising: forming on at least one of a metal layer or a polymer layer of a die a surface layer that includes an adhesion-functional group; and applying to the surface layer a next layer to adhere to the surface layer with the adhesion-functional group.

Example 2 may include the method of example 1, wherein the at least one of the metal layer or the polymer layer is a polymer layer and forming the surface layer includes copolymerizing on the polymer layer a polar monomer that includes the adhesion-functional group.

Example 3 may include the method of example 2, wherein forming the surface layer further comprises: dispensing on the polymer layer a solution that includes a photoinitiator and the polar monomer with the adhesion-functional group; and exposing the solution to light to form the surface layer on the polymer layer.

Example 4 may include the method of example 3 wherein exposing the solution to light copolymerizes the polar monomer on the polymer layer.

Example 5 may include the method of any of examples 2-4 wherein the adhesion-functional group includes an amine group.

Example 6 may include the method of example 5 wherein the next layer includes silica.

Example 7 may include the method of any of examples 2-4 wherein the adhesion-functional group includes a cyano group.

Example 8 may include the method of example 7 wherein the next layer includes a metal.

Example 9 may include the method of any of examples 2-4 wherein the adhesion-functional group includes a hydroxyl group.

Example 10 may include the method of any examples 2-4 wherein the next layer includes a second polymer layer.

Example 11 may include the method of example 2 wherein the polar monomer further includes a second adhesion-functional group.

Example 12 may include the method of example 1, wherein the at least one of the metal layer or the polymer layer is a metal layer and forming the surface layer includes forming on the metal layer a self-assembled monolayer that includes amine group terminations.

Example 13 may include the method of example 12, wherein applying the next layer further comprises: forming the next layer as a dielectric layer; and heat-treating the die to affix the dielectric layer to the metal layer.

Example 14 may include the method of any of examples 12-13 wherein forming the self-assembled monolayer includes applying to the metal layer an ethanolic solution that includes an alkane thiol with a terminal amine group.

Example 15 may include the method of example 14 wherein applying the solution to the metal layer includes immersing the die in the solution.

Example 16 may include an integrated circuit (IC), comprising: a polymer layer of a first monomer on a die; a polymer surface layer with a polar monomer that is copolymerized on the polymer layer, wherein the polar monomer includes a functional group and the polymer layer is free from the functional group.

Example 17 may include the IC of example 16 further comprising a subsequent layer applied to the polymer surface layer with adhesion functional by the functional group.

Example 18 may include the IC of example 16 wherein the functional group includes an amine group.

Example 19 may include the IC of example 16 wherein the functional group includes a cyano group.

Example 20 may include the IC of example 19 wherein the next layer includes a metal.

Example 21 may include the IC of example 16 wherein the functional group includes a hydroxyl group.

Example 22 may include the IC of example 18 in which the next layer includes silica.

Example 23 may include the IC of example 21 in which the next layer includes a solder resist.

Example 24 may include the IC of example 16 in which the next layer includes a second polymer layer.

Example 25 may include the IC of example 24 in which the second polymer layer embeds the die in an IC package assembly.

Example 26 may include the IC of example 24 in which the second polymer layer includes an underfill material.

Example 27 may include an integrated circuit (IC), comprising: a die with multiple layers that include a metal layer; a surface layer on the metal layer, wherein the surface layer includes amine group terminations; and a heat-treated dielectric layer on the surface layer.

Example 28 may include the IC of example 27 wherein the surface layer includes a self-assembled monolayer.

Example 29 may include the IC of example 28 wherein the self-assembled monolayer is thiol-based.

Example 30 may include a method of fabricating an integrated circuit (IC), the method comprising: providing a die with a polymer layer; dispensing on the polymer layer a solution that includes a polar monomer and a photoinitiator; exposing the solution to light to form on the polymer layer an adhesion-receptive polymer surface; and applying a next layer to the adhesion-receptive polymer surface.

Example 31 may include the method of example 30 in which exposing the solution to light copolymerizes the polar monomer on the polymer layer to form the adhesion-receptive polymer surface.

Example 32 may include the method of example 30 in which the polar monomer includes an amine group.

Example 33 may include the method of example 32 in which the next layer includes silica.

Example 34 may include the method of example 30 in which the polar monomer includes a cyano group.

Example 35 may include the method of example 34 in which the next layer includes a metal.

Example 36 may include the method of example 30 in which the polar monomer includes a hydroxyl group.

Example 37 may include the method of example 36 in which the next layer includes a solder resist.

Example 38 may include the method of example 30 in which the next layer includes a second polymer layer.

Example 39 may include the method of example 30 in which the light includes ultra-violet light.

Example 40 may include a method of fabricating an integrated circuit (IC), the method comprising: providing a die with a first metal layer; forming on the metal layer a self-assembled monolayer that includes amine group terminations; forming a dielectric layer on the self-assembled monolayer; and heat-treating the die.

Example 41 may include the method of example 40 in which forming the self-assembled monolayer includes applying to the first metal layer a solution that includes an alkane thiol with a terminal amine group.

Example 42 may include the method of example 41 in which the solution is ethanolic.

Example 43 may include the method of any of examples 41-42 in which applying the solution to the first metal layer includes immersing the die in the solution.

Example 44 may include the method of example 40 in which forming a dielectric layer on the self-assembled monolayer includes applying a dielectric epoxy resin.

Example 45 may include a method of fabricating an integrated circuit (IC), the method comprising: providing a die with a first metal layer; applying to the first metal layer an ethanolic solution that includes an alkane thiol with a terminal amine group to form a surface layer with amine group terminations; applying a dielectric layer on the surface layer; and heat-treating the die.

Example 46 may include the method of example 45 in which applying the ethanolic solution to the first metal layer includes immersing the die in the ethanolic solution.

Example 47 may include the method of example 45 in which applying the dielectric layer on the surface layer includes applying a dielectric epoxy resin.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of fabricating an integrated circuit (IC), the method comprising:
    forming on at least one of a metal layer or a polymer layer of a die, a surface layer that includes an adhesion-functional group; and
    applying to the surface layer a next layer to adhere to the surface layer with the adhesion-functional group,
    wherein the at least one of the metal layer or the polymer layer is a polymer layer and forming the surface layer includes copolymerizing on the polymer layer a polar monomer that includes the adhesion-functional group, and
    wherein forming the surface layer further includes dispensing on the polymer layer a solution that includes a photoinitiator and the polar monomer with the adhesion-functional group and exposing the solution to light to form the surface layer on the polymer layer.

2. The method of claim 1 wherein exposing the solution to light copolymerizes the polar monomer on the polymer layer.

3. The method of claim 1 wherein the adhesion-functional group includes an amine group.

4. The method of claim 3 wherein the next layer includes silica.

5. The method of claim 1 wherein the adhesion-functional group includes a cyano group.

6. The method of claim 5 wherein the next layer includes a metal.

7. The method of claim 1 wherein the adhesion-functional group includes a hydroxyl group.

8. The method of claim 1 wherein the next layer includes a second polymer layer.

9. The method of claim 1 wherein the polar monomer further includes a second adhesion-functional group.

10. A method of fabricating an integrated circuit (IC), the method comprising:
    forming on at least one of a metal layer or a polymer layer of a die a surface layer that includes an adhesion-functional group; and
    applying to the surface layer a next layer to adhere to the surface layer with the adhesion-functional group,
    wherein the at least one of the metal layer or the polymer layer is a metal layer and forming the surface layer includes forming on the metal layer a self-assembled monolayer that includes amine group terminations.

11. The method of claim 10, wherein applying the next layer further comprises:
    forming the next layer as a dielectric layer; and
    heat-treating the die to affix the dielectric layer to the metal layer.

12. The method of claim 10 wherein forming the self-assembled monolayer includes applying to the metal layer an ethanolic solution that includes an alkane thiol with a terminal amine group.

13. The method of claim 12 wherein applying the solution to the metal layer includes immersing the die in the solution.

* * * * *